United States Patent
Mitsui

(10) Patent No.: US 10,888,019 B2
(45) Date of Patent: Jan. 5, 2021

(54) ELECTRONIC DEVICE

(71) Applicant: NEC Corporation, Tokyo (JP)

(72) Inventor: Tomoyuki Mitsui, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 16/545,586

(22) Filed: Aug. 20, 2019

(65) Prior Publication Data

US 2020/0084911 A1 Mar. 12, 2020

(30) Foreign Application Priority Data

Sep. 7, 2018 (JP) ................................ 2018-167936

(51) Int. Cl.
H05K 7/20 (2006.01)

(52) U.S. Cl.
CPC ..... H05K 7/20145 (2013.01); H05K 7/20154 (2013.01)

(58) Field of Classification Search
CPC ......... H01L 23/467; G06F 1/20; G06F 1/203; G06F 1/206; G06F 2200/201; G06F 1/181; G06F 1/182; H05K 7/20145; H05K 7/20154; H05K 7/20; H05K 7/20136; H05K 7/20754; H05K 2201/066; H05K 9/0022
USPC .............. 361/679.49, 695, 679.54, 697, 718; 165/80.3, 104.33, 906; 257/712
See application file for complete search history.

(56) References Cited

U.S. PATENT DOCUMENTS

| | | | |
|---|---|---|---|
| 6,462,948 B1* | 10/2002 | Leija | H05K 7/20727 165/104.33 |
| 6,999,312 B1* | 2/2006 | Garnett | H01L 23/467 165/80.3 |
| 10,602,639 B2* | 3/2020 | Chang | H05K 7/20727 |
| 2013/0155606 A1* | 6/2013 | Sasaki | G06F 1/20 361/679.47 |

FOREIGN PATENT DOCUMENTS

| | | |
|---|---|---|
| JP | 5-160311 A | 6/1993 |
| JP | 10-502217 A | 2/1998 |
| JP | 2001-257494 A | 9/2001 |
| JP | 2002-094275 A | 3/2002 |
| JP | 2004-020171 A | 1/2004 |
| JP | 2013-128048 A | 6/2013 |
| JP | 2017-168779 A | 9/2017 |

OTHER PUBLICATIONS

Communication dated Oct. 8, 2019 from the Japanese Patent Office in application No. 2018-167936.

* cited by examiner

Primary Examiner — Mandeep S Buttar
(74) Attorney, Agent, or Firm — Sughrue Mion, PLLC

(57) ABSTRACT

An electronic device includes a board to which a heat generation component is attached, a heat sink that radiates heat generated by the heat generation component, a cooling target component that is between the board and the heat sink and is attached to the board, and a duct that takes in a part of a cooling air flow for cooling at least the heat sink and introduces the cooling air flow which is taken in to the cooling target component, thereby sufficiently cooling the cooling target component that is between the heat sink increased in size and the board and is positioned on a side to which the cooling air flow being applied to the heat sink flows away from the heat sink.

6 Claims, 11 Drawing Sheets

ELECTRONIC DEVICE

This application is based upon and claims the benefit of priority from Japanese Patent Application No. 2018-167936, filed on Sep. 7, 2018, the disclosure of which is incorporated herein in its entirety by reference.

TECHNICAL FIELD

The present invention relates to a technique of cooling an electronic device.

BACKGROUND ART

Due to information processing performance of components of an integrated circuit and the like mounted on an electronic device has been improved, calorific values of the components tend to increase. Meanwhile, because of a rising demand that components whose calorific values are high be mounted in high density on an electronic device, an expectation for a technique for improving cooling efficiency of an electronic device is rising.

The patent literature 1 (Japanese unexamined patent application publication no. 2001-257494) discloses, as a technique related to such a technique, an electronic device having a heat radiation structure in which a heat radiation member such as a heat sink is attached to a heat generation component such as a central processing unit (CPU), and cooling is performed by a fan. In the electronic device, a cooling air flow is divided in such a way that the cooling air flow generated by the fan is applied not only to the heat radiation member but also to the heat generation component and surroundings, in a printed circuit board, of a location where the heat generation component is attached.

Further, the patent literature 2 (Japanese unexamined patent application publication no. 2013-128048) discloses a cooling device including a heat sink installed on a heat generation body placed in a housing, a heat radiation member that thermally connects the heat sink and the housing to each other, a dedicated duct for introducing a cooling air flow directly to the heat generation body, and a dedicated fan for sending out the cooling air flow to the dedicated duct. The heat radiation member in the cooling device is a member like a leaf spring, and contacts against an upper surface portion of the heat sink and an inner surface portion of the housing by predetermined elastic force.

Furthermore, the patent literature 3 (Japanese unexamined patent application publication no. 2002-094275) discloses a cooling device in which a width space of a ventilation duct that covers a cooling fin (heat sink) contacting with an electric element in a heat transferring manner is formed in such a way as to be wider than the cooling fin, and thereby, an extra space is formed beside the cooling fin. In the cooling device, the electric element originally placed outside and near the cooling duct is accommodated in the extra space. Then, in the cooling device, a part of the cooling air flow generated by a cooling fan that supplies the air flow to the cooling fin is collected and supplied to the extra space.

Further, the patent literature 4 (Japanese unexamined patent application publication (translation of PCT application) no. H10-502217) discloses a cooling system including a blower (fan), a first heat sink attached to a first microprocessor, and a first air duct that couples the blower to the first heat sink. The blower in the cooling system is provided with a port for taking in air from an outside of a computer system. The blower generates an air flow flowing through the first air duct to the first heat sink and thereby cooling the first microprocessor. The cooling system further includes a second air duct coupled to the first heat sink, and introduces the air flow to a second heat sink, thereby cooling a second microprocessor to which the second heat sink is attached.

SUMMARY

A heat sink attached to a heat generation component such as a CPU tends to increase in size in order to cool the heat generation component whose calorific value has increased accompanying that information processing performance of the heat generation component has been improved.

FIG. 10 is a plan view illustrating a cooled state of a component mounted on a general electronic device 3 before a heat sink 33 of a CPU 32 in the electronic device 3 is increased in size. In the electronic device 3 illustrated in FIG. 10, a cooling air flow generated by a fan (not illustrated) flows in a negative direction of an X axis in a three-dimensional coordinate space. Then, in the electronic device 3, after the cooling air flow passes through the heat sink 33 attached to the CPU 32, the cooling air flow also reaches a cooling target component 34 positioned downstream of the CPU 32 in the cooling air flow, and thus, the cooling target component 34 can be cooled.

FIG. 11 illustrates a cooled state of a component mounted on an electronic device 3 after the heat sink 33 is replaced with a heat sink 33A increased in size when the CPU 32 in the general electronic device 3 illustrated in FIG. 10 is replaced with a CPU 32A whose performance is higher and whose calorific value is larger.

As illustrated in FIG. 11, a cooling target component is placed between the heat sink increased in size and a board. In this case, as illustrated in FIG. 11, a cooling air flow does not sufficiently reach the cooling target component positioned downstream of the CPU in the cooling air flow (i.e., positioned on the side to which the cooling air flow being applied to the heat sink flows away from the heat sink), and thus, a problem exists in that it becomes difficult to sufficiently cool the cooling target component. The above-described patent literatures 1 to 4 do not describe a means or a method for solving such a problem. A main object of the present invention is to provide an electronic device that solves the problem.

An electronic device according to one aspect of the present invention includes: a board to which a heat generation component is attached; a heat sink that radiates heat generated by the heat generation component; a cooling target component that is between the board and the heat sink, and is attached to the board; and a duct that takes in a part of a cooling air flow for cooling at least the heat sink, and introduces the cooling air flow which is taken in to the cooling target component.

The present invention is able to sufficiently cool a cooling target component that is between a heat sink increased in size and a board and is positioned on a side to which a cooling air flow being applied to the heat sink flows away from the heat sink.

DETAILED DESCRIPTION

Figure 1:
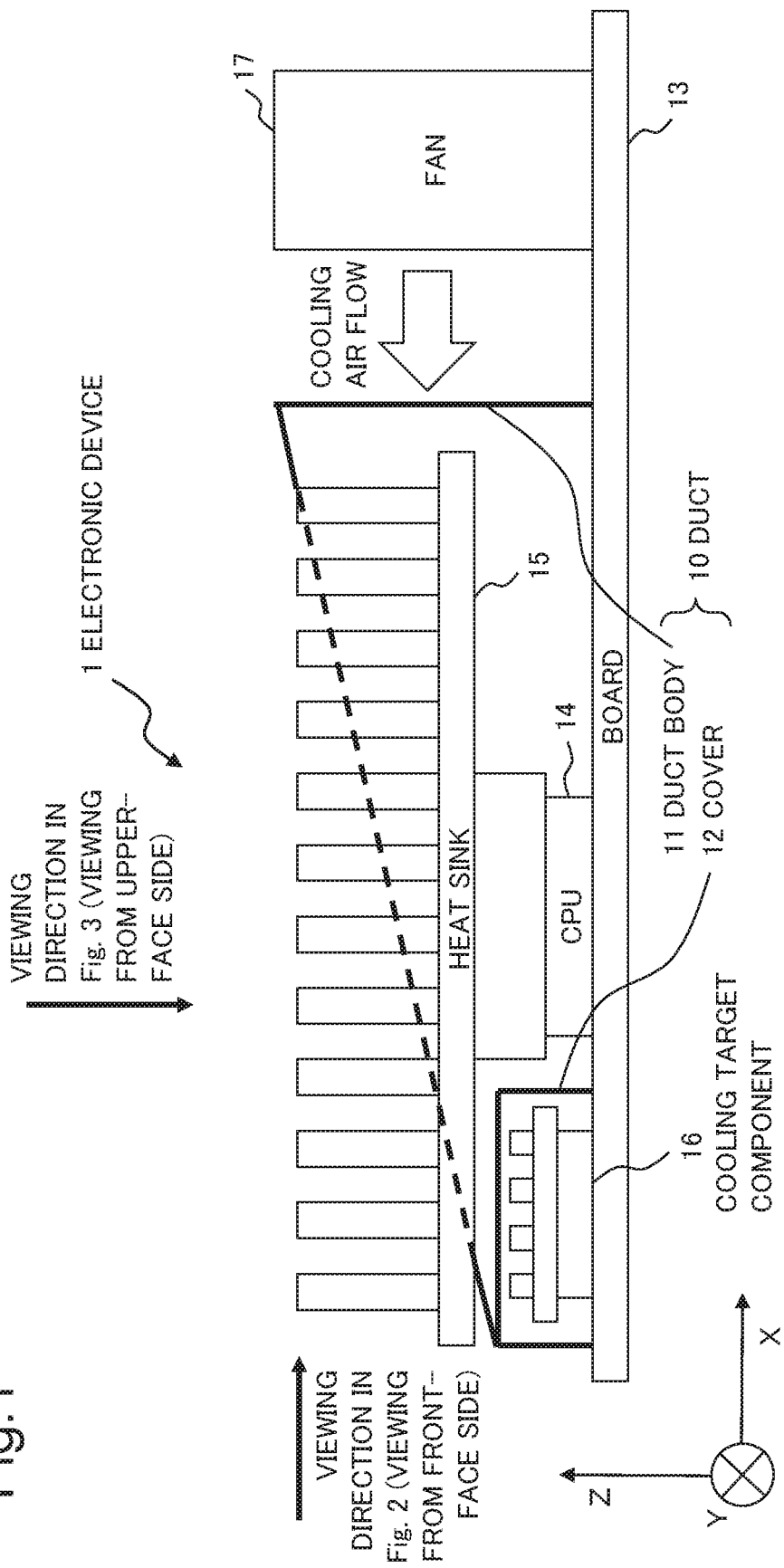
FIG. 1 is a plan view in the case of viewing, from a side-face side, an electronic device 1 according to a first example embodiment of the present invention.

Hereinafter, example embodiments of the present invention are described in detail with reference to the drawings. Note that for convenience of the description, the following description is made with a three-dimensional (X-Y-Z) coordinate space appropriately illustrated in the drawings. In each of the example embodiments described below, viewing (looking) in a positive direction of an X axis is defined as "viewing from a front-face side", viewing in a positive direction of an Y axis is defined as "viewing from a side-face side", and viewing in a negative direction of a Z axis is defined as "viewing from an upper-face side".

First Example Embodiment

An electronic device 1 according to a first example embodiment of the present invention is described with reference to FIG. 1 to FIG. 4.

Figure 2:
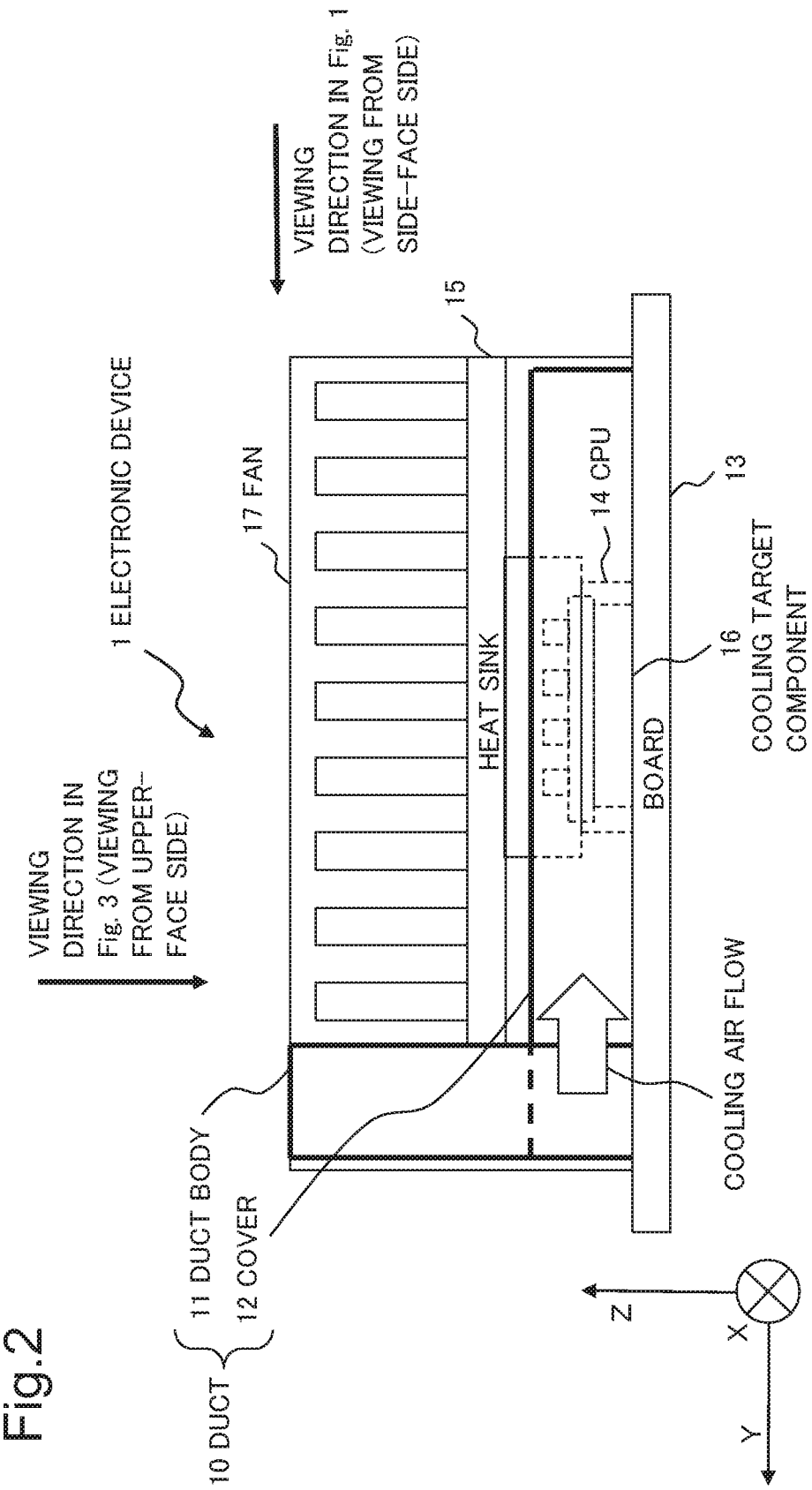
FIG. 2 is a plan view in the case of viewing, from a front-face side, the electronic device 1 according to the first example embodiment of the present invention.
Figure 3:
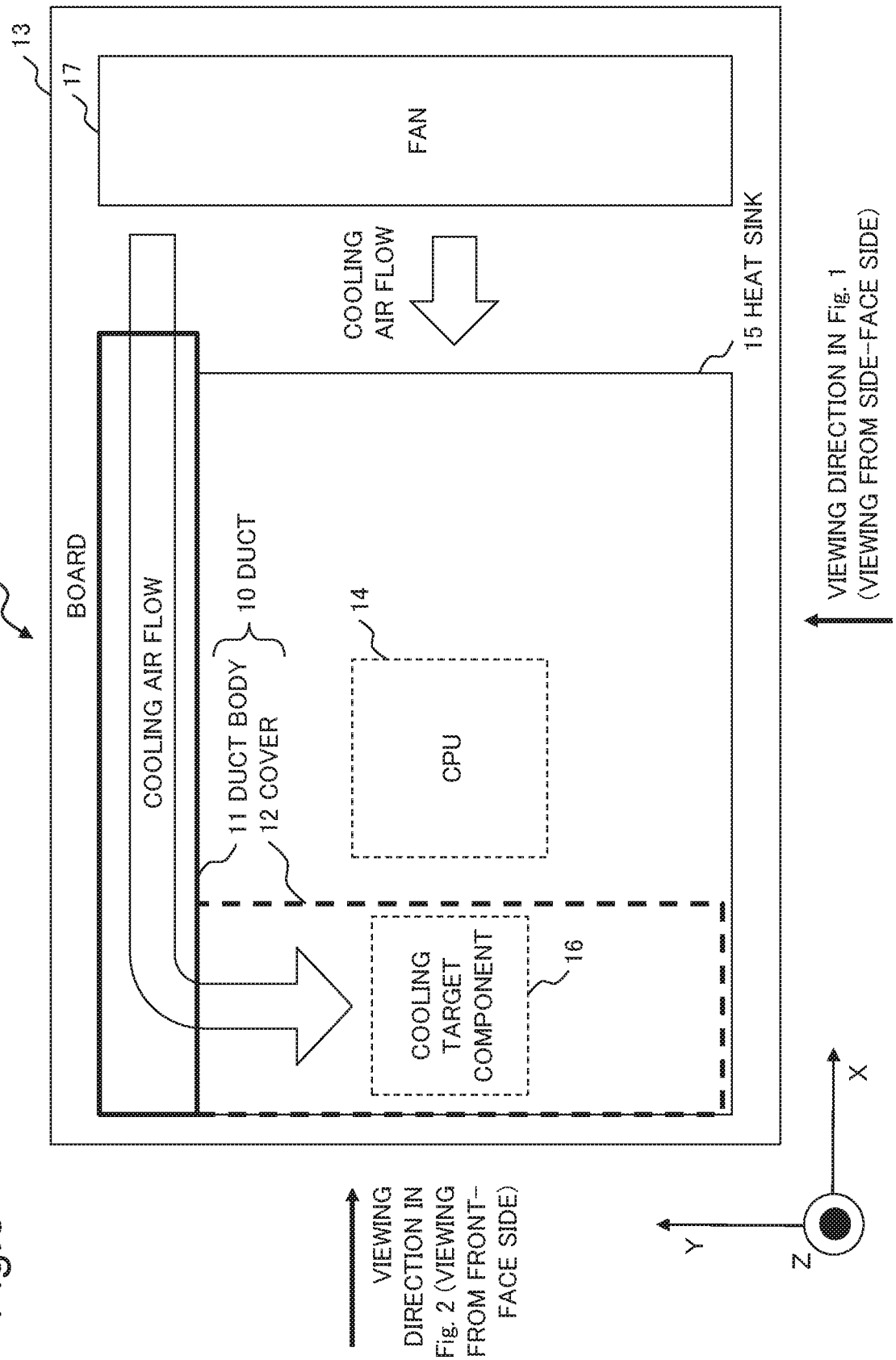
FIG. 3 is a plan view in the case of viewing, from an upper-face side, the electronic device 1 according to the first example embodiment of the present invention.
Figure 4:
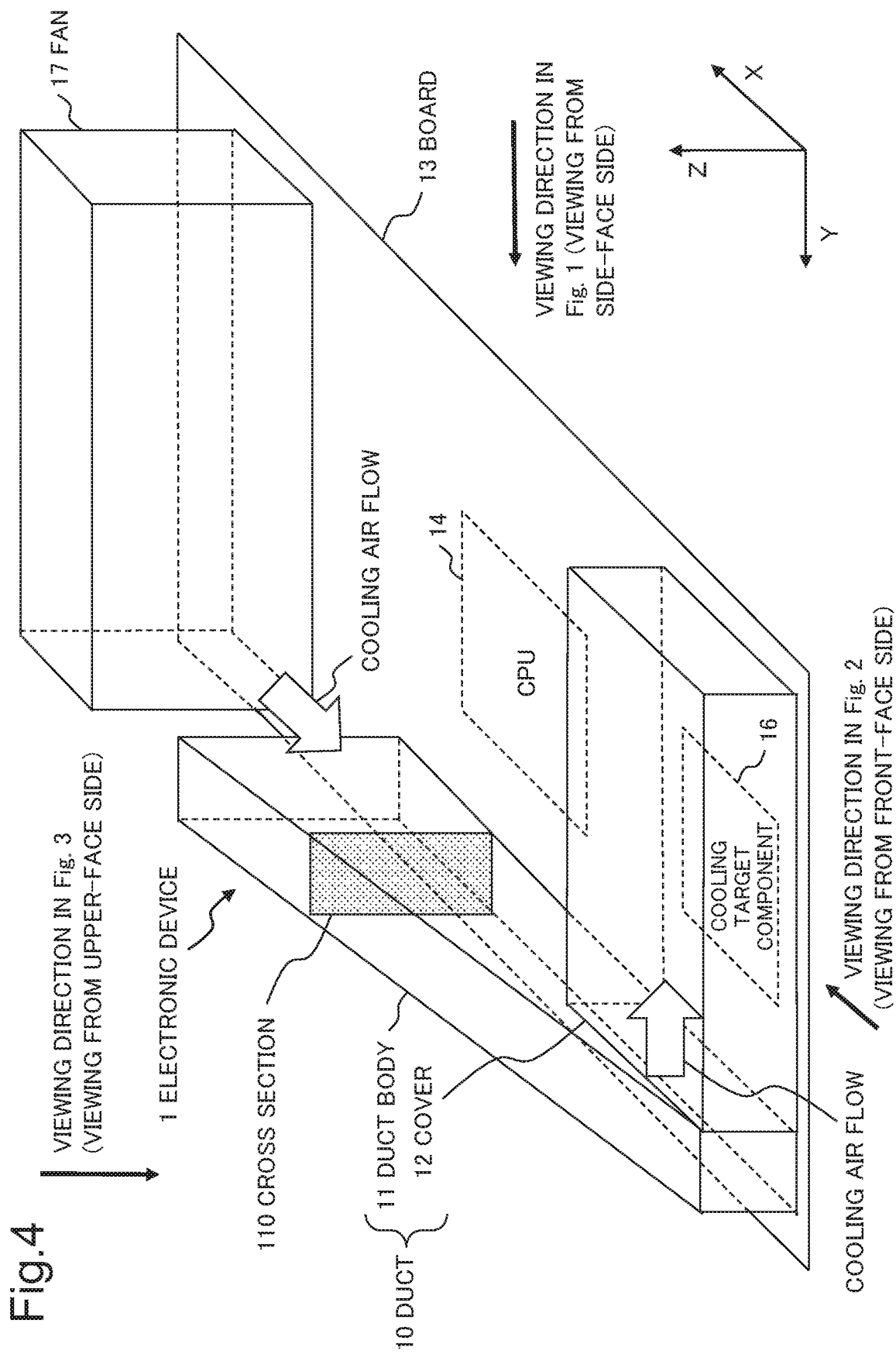
FIG. 4 is a perspective view of the electronic device 1 according to the first example embodiment of the present invention.

FIG. 1 is a plan view (XZ plan view) in the case of viewing, from the side-face side, the electronic device 1 according to the present example embodiment. FIG. 2 is a plan view (YZ plan view) in the case of viewing, from the front-face side, the electronic device 1 according to the present example embodiment. FIG. 3 is a plan view (XY plan view) in the case of viewing, from the upper-face side, the electronic device 1 according to the present example embodiment. FIG. 4 is a perspective view of the electronic device 1 according to the present example embodiment. Note that in FIG. 4, for convenience of the description, an illustration of the below-described heat sink 15 is omitted.

As illustrated in FIG. 1 to FIG. 4, the electronic device 1 according to the present example embodiment includes a duct body 11, a cover 12, a board 13, a CPU 14, a heat sink 15, a cooling target component 16, and a fan 17.

A cooling air flow for cooling at least the CPU 14, the heat sink 15, and the cooling target component 16 placed in the board 13 is generated by the fan 17 in such a way as to flow in a negative direction of the X axis. Note that the cooling air may also cool components, placed in the board 13, other than the CPU 14, the heat sink 15, and the cooling target component 16.

The heat sink 15 that radiates heat generated by the CPU 14 is attached to the CPU 14, and a cooling air flow generated by the fan 17 reaches the heat sink 15, thereby cooling the CPU 14.

The cooling target component 16 is positioned downstream of the heat sink 15 in the cooling air flow (i.e., positioned on an X-axis negative-direction side of the heat sink 15), is between the board 13 and the heat sink 15, and is attached to (mounted on) the board 13. In other words, the cooling target component 16 is placed at a position to which arrival of the cooling air flow is blocked by the heat sink 15 positioned upstream in the cooling air flow (i.e., positioned on an X-axis positive-direction side of the cooling target component 16).

For example, the cooling target component 16 according to the present example embodiment is a component that satisfies at least one of a matter that a calorific value thereof is equal to or larger than a criterion and a matter that heat resistance thereof is equal to or higher than a criterion. Note that the criterion indicates a relation between the calorific value or the heat resistance and occurrence of malfunction. In other words, the cooling target component 16 is a component that malfunctions at a high possibility in the case of being not sufficiently cooled (i.e., the component of high priority for cooling).

For example, the cooling target component 16 is a field effect transistor (FET) as a power supply component that is mounted on a graphics processing unit (GPU) module as the electronic device 1 and whose calorific value is large. Alternatively, for example, the cooling target component 16 may be a component such as an optical module whose calorific value is small, but whose heat resistance is low (that is weak against heat). Note that the cooling target component 16 according to the present example embodiment may be a component to which a heat sink is attached, or may be a component to which a heat sink is not attached. In the present example embodiment, when the cooling target component 16 is a component to which a heat sink is attached, this component including the heat sink is referred to as the cooling target component 16.

The duct body 11 and the cover 12 constitute a duct 10 through an inside of which a cooling air flow generated by the fan 17 passes. The duct body 11 and the cover 12 may be integrally formed, or the form may be made by connecting separate members. At a position where the heat sink 15 does not exist, the duct 10 according to the present example embodiment is formed on a route through which the cooling air flow reaches an inlet thereof and on a route through which the cooling air flow reaches the cooling target component 16. In other words, the duct 10 according to the present example embodiment is formed in such a way as to take in a part of the cooling air flow generated by the fan 17 and introduce the taken-in cooling air flow to the cooling target component 16.

On a side of a face (attachment face) that belongs to the board 13 and to which the CPU 14 and the cooling target component 16 are attached, the duct body 11 is placed, at a side face of (beside) the heat sink 15, along an advancing direction of a cooling air flow discharged from the fan 17 (i.e., placed in parallel or substantially parallel with the X axis). In other words, the duct body 11 extends along at least one face that is among respective faces forming an outer shape of the heat sink 15 and that is different from the face (the face in parallel or substantially parallel with a YZ plane)

on a side from which the cooling air flow is taken in and is different from the face (the face in parallel or substantially parallel with the YZ plane and on an X-axis negative-direction side of the face on the side from which the cooling air flow is taken in) on a side from which the cooling air flow flows away.

Further, as illustrated in FIG. 1 and FIG. 4, the duct body 11 is formed in such a way that a cross section (a cross section 110 illustrated in FIG. 4) perpendicular or substantially perpendicular to the direction in which the duct body 11 extends expands toward the inlet for taking in the cooling air flow (expands toward an X-axis positive-direction side).

The cover 12 is formed, between the heat sink 15 and the board 13, in parallel or substantially parallel with the Y axis in such a way as to cover the cooling target component 16, and is connected to the duct body 11. At a connection portion between the duct body 11 and the cover 12, a hole through which the cooling air flow can pass is opened.

A cooling air flow discharged from the fan 17 first advances inside the duct body 11 in the negative direction of the X axis, and then passes through the hole at the connection portion between the duct body 11 and the cover 12. Next, the cooling air flow that has passed through the hole advances inside the cover 12 in a negative direction of the Y axis, and thus reaches the cooling target component 16.

Further, the cover 12 also has a function as a flange for supporting (improving strength of or reinforcing) the board 13. Note that in the present patent application, a member that supports the board 13 is referred to as a flange. The cover 12 may be formed by using a flange originally mounted on the board 13. In the case of improving (prioritizing) the function of the cover 12 as the flange, a material thereof is desirably metal such as aluminum, for example.

Furthermore, at least a part of the cover 12 is placed between the cooling target component 16 and each of the CPU 14 and the heat sink 15. Accordingly, the cover 12 has a function of making thermal insulation between the cooling target component 16 and each of the CPU 14 and the heat sink 15 when a material thereof has a heat blocking (thermal insulation) property. In order to improve (prioritize) such a heat blocking function of the cover 12, it is desirable that a material thereof is resin such as plastic, for example. Alternatively, the cover 12 may be formed using a member whose thermal insulation performance is improved by making an inside a vacuum, for example.

The electronic device 1 according to the present example embodiment is able to sufficiently cool the cooling target component that is between the heat sink increased in size and the board and that is positioned on the side to which the cooling air flow having been applied to the heat sink flows away from the heat sink. The reason is that the electronic device 1 includes the duct 10 (the duct body 11 and the cover 12) that takes in a part of the cooling air flow for cooling at least the heat sink 15 and that introduces the taken-in cooling air flow to the cooling target component 16.

Hereinafter, the detailed description is made on advantageous effects achieved by the electronic device 1 according to the present example embodiment.

Figure 10:
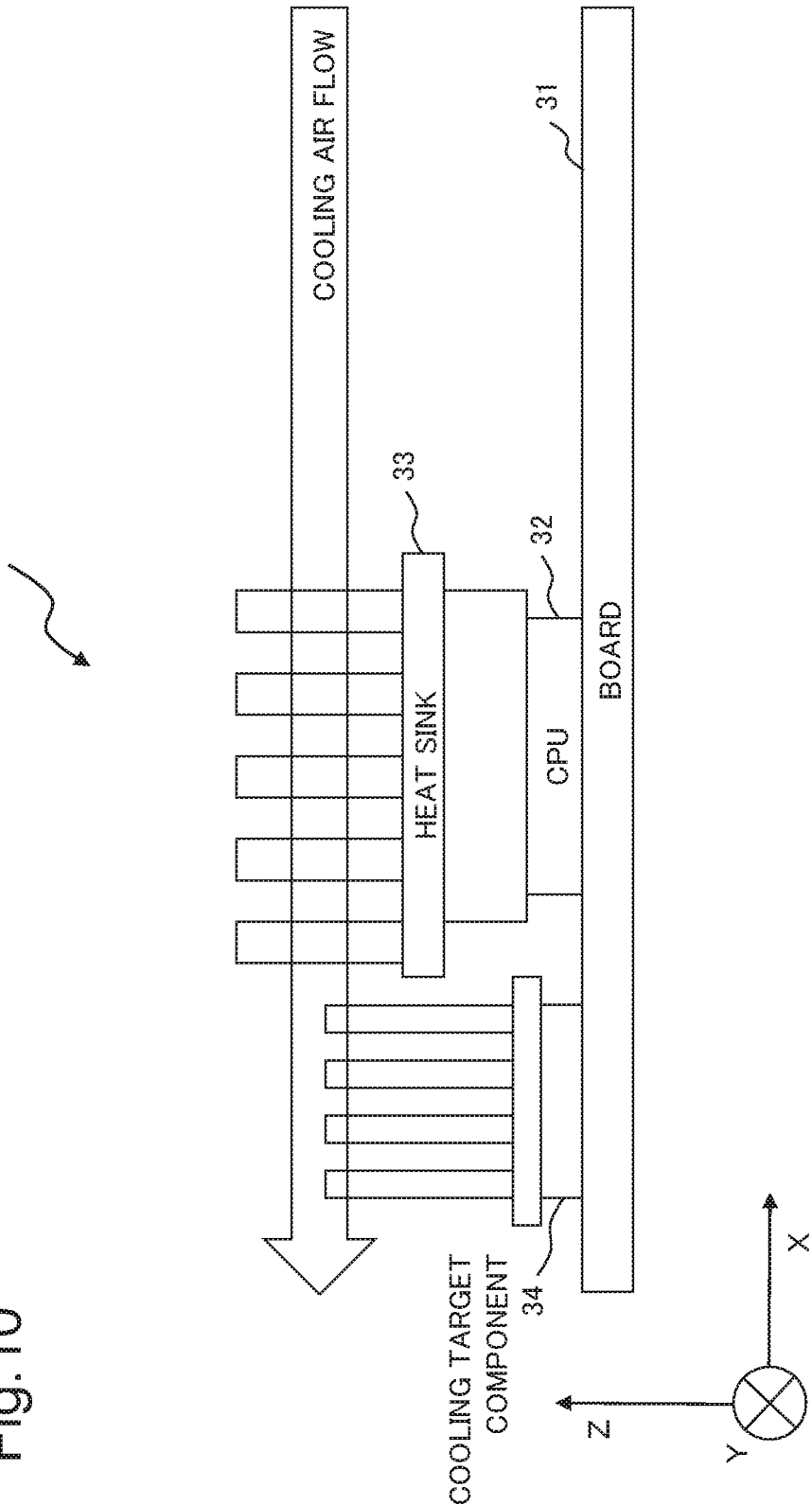
FIG. 10 is a plan view illustrating a cooled state of a mounted component before a heat sink of a CPU in a general electronic device 3 is increased in size.
Figure 11:
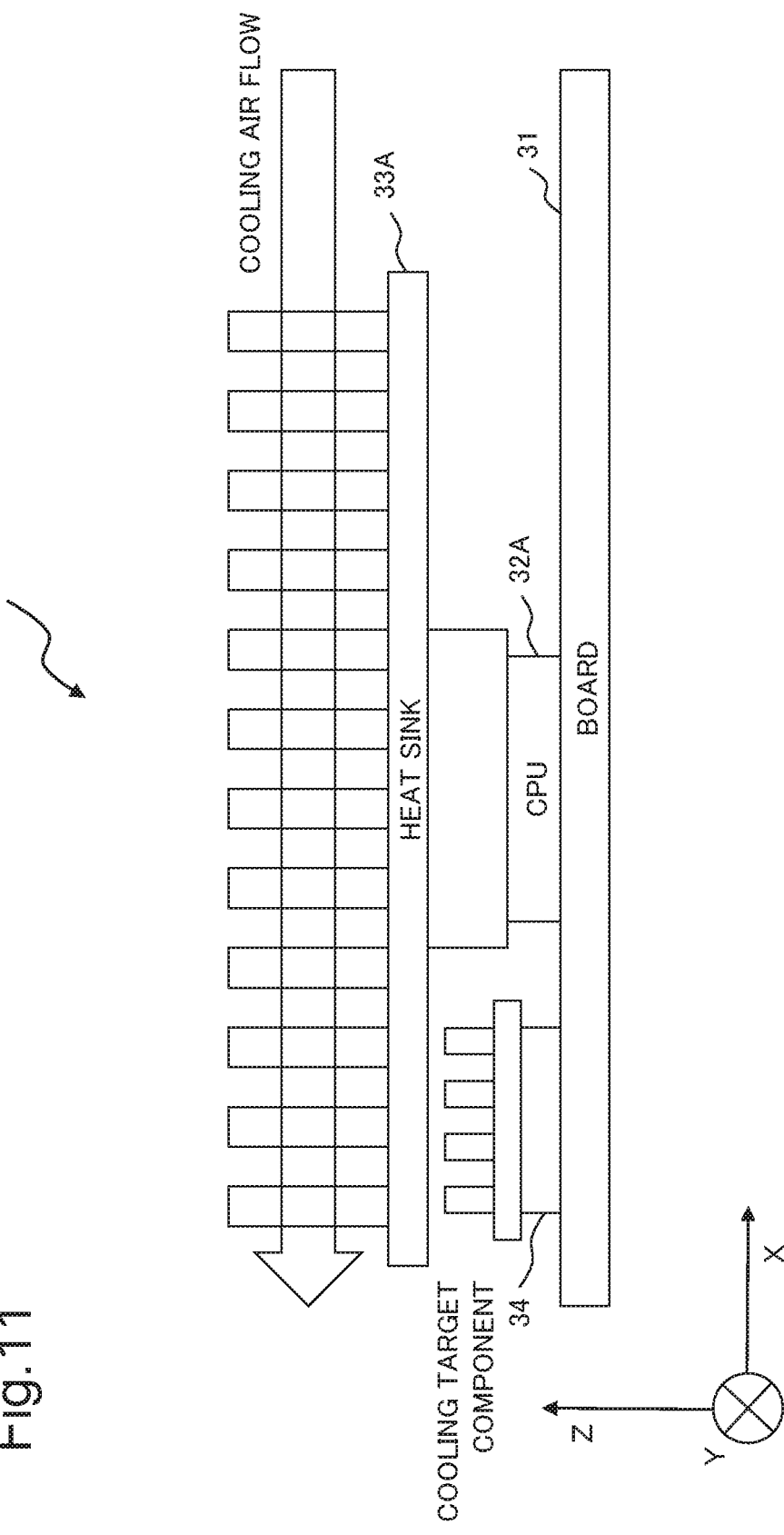
FIG. 11 is a plan view illustrating a cooled state of a mounted component after a heat sink of a CPU in a general electronic device 3 is increased in size.

A heat sink attached to a heat generation component such as a CPU tends to increase in size in order to cool the heat generation component whose calorific value has increased accompanying that information processing performance of the heat generation component has been improved. The positional relation in the board between the CPU 32(A) and the cooling target component 34 is equivalent between the above-described electronic device 3 illustrated in FIG. 10 and the electronic device 3 illustrated in FIG. 11. One of the reasons is that the cooling target component 34 cannot be placed at a distance from the CPU 32(A) because of necessity of maintaining performance and reliability of processing performed between the cooling target component 34 (e.g., a memory, an input-output control circuit, or the like) and the CPU 32(A) (i.e., necessity that signal transmission time and the like of communication performed between the CPU 32(A) and the cooling target component 34 satisfy a criterion). Another reason why it is difficult to change the positional relation between the CPU 32(A) and the cooling target component 34 is that cost greatly increases when a material or the like of the board 31 is changed to a material or the like enabling higher-speed communication for example in order to enable the placement at a distance from the CPU 32(A).

In other words, in terms of maintaining performance and reliability of the electronic device, or in terms of cost or the like, it is generally difficult to change the positional relation in the board between the heat generation component and the cooling target component around the heat sink after the heat sink is increased in size. Accordingly, in this case, the cooling target component is placed between the heat sink increased in size and the board. In this case, the cooling air flow does not sufficiently reach the cooling target component positioned downstream of the heat generation component in the cooling air flow, thus causing a problem that it becomes difficult to sufficiently cool the cooling target component.

With regard to such a problem, the electronic device 1 according to the present example embodiment includes the board 13 to which the CPU 14 (heat generation component) is attached, the heat sink 15 that radiates heat generated by the CPU 14, and the cooling target component 16 attached to the board 13 and positioned between the board 13 and the heat sink 15. Then, the electronic device 1 includes the duct 10 that takes in a part of the cooling air flow for cooling at least the heat sink 15 and that introduces the taken-in cooling air flow to the cooling target component 16. Thereby, the electronic device 1 according to the present example embodiment causes the cooling air flow to bypass the heat sink 15 preventing the cooling air flow from reaching the cooling target component 16, and thus, is able to sufficiently cool the cooling target component 16 that is between the heat sink 15 increased in size and the board 13 and that is positioned on the side to which the cooling air flow having been applied to the heat sink 15 flows away from the heat sink 15 (i.e., positioned downstream of the heat sink 15 in the cooling air flow).

Further, the duct 10 (duct body 11) according to the present example embodiment is formed in such a way that the cross section perpendicular or substantially perpendicular to the direction in which the duct 10 extends expands toward the inlet for taking in the cooling air flow. In other words, the duct 10 is formed in such a way as to increase a quantity of the air flow flowing into an inside thereof as much as possible, and to increase a velocity of the cooling air flow flowing in the inside. Thereby, the electronic device 1 according to the present example embodiment is able to improve efficiency of cooling the cooling target component 16. Note that a shape of the duct 10 (duct body 11) according to the present example embodiment is not limited to a shape in which a cross section thereof perpendicular or substantially perpendicular to the direction in which the duct 10 extends expands toward the inlet for taking in the cooling air flow.

Further, the duct 10 (cover 12) according to the present example embodiment is formed in such a way as to include at least a part of a flange that supports (improves the strength of) the board 13. In other words, in the electronic device 1, the duct and the flange are not individually formed, but the duct 10 having a function as the flange is formed, and thus, the electronic device 1 is able to efficiently achieve both cooling of the cooling target component 16 and reinforcing of the board 13. Note that the duct 10 (cover 12) according to the present example embodiment may be formed in such a way as not to include the flange.

Furthermore, at least a part of the duct 10 (cover 12) according to the present example embodiment is placed between the CPU 14 and the cooling target component 16. For this reason, when the duct 10 is formed of a material having a heat blocking (thermal insulation) property, the electronic device 1 thereby has a function of thermal insulation between the CPU 14 and the cooling target component 16. Accordingly, when the cooling target component 16 is a power supply component or the like whose calorific value is large, the electronic device 1 is able to prevent the CPU 14 and the cooling target component 16 from failing due to temperature rising caused by mutual heat generation. In another case where the cooling target component 16 is a component such as an optical module whose calorific value is small but whose heat resistance is low, the electronic device 1 is able to prevent the cooling target component 16 from failing due to temperature rising caused by heat generation of the CPU 14.

Further, the fan 17 according to the present example embodiment is not limited to a push-type fan that discharges, from the side of the face where the heat sink 15 takes in the cooling air flow (i.e., from the upstream of the heat sink 15), the cooling air flow. For example, the fan 17 may be a pull-type fan that sucks, from the side to which the cooling air flows away from the heat sink 15 (i.e., from the downstream of the heat sink 15), the cooling air flow.

Further, instead of being mounted on the electronic device 1, the fan 17 according to the present example embodiment may be mounted on a device or a rack on which the electronic device 1 is mounted. Furthermore, instead of being generated by the fan 17, the cooling air flow may be generated by air conditioning equipment at a place where the electronic device 1 is installed, for example.

In addition, the duct 10 according to the present example embodiment may be a simple duct constituted by only the duct body 11, without including the cover 12.

Further, the electronic device 1 according to the present example embodiment may include a heat generation component such as an integrated circuit that is not a CPU, instead of including the CPU 14.

Second Example Embodiment

An electronic device 1A according to a second example embodiment of the present invention is described with reference to FIG. 5 to FIG. 8. In the present example embodiment, regarding the constituents having the functions similar to those in the first example embodiment described above, the same reference symbols as those of the first example embodiment are attached, and thus, the detailed description is omitted.

Figure 5:
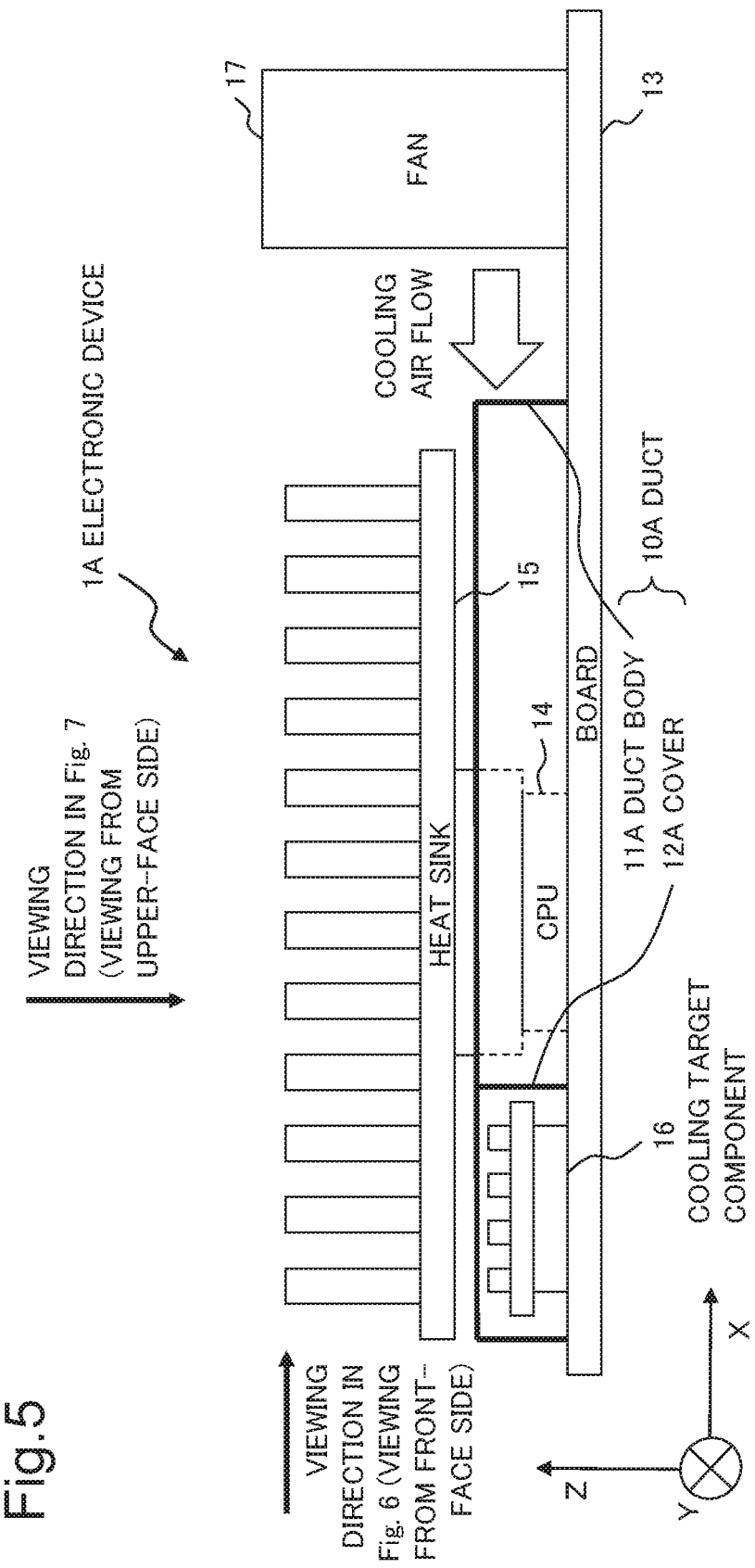
FIG. 5 is a plan view in the case of viewing, from a side-face side, an electronic device 1A according to a second example embodiment of the present invention.
Figure 6:
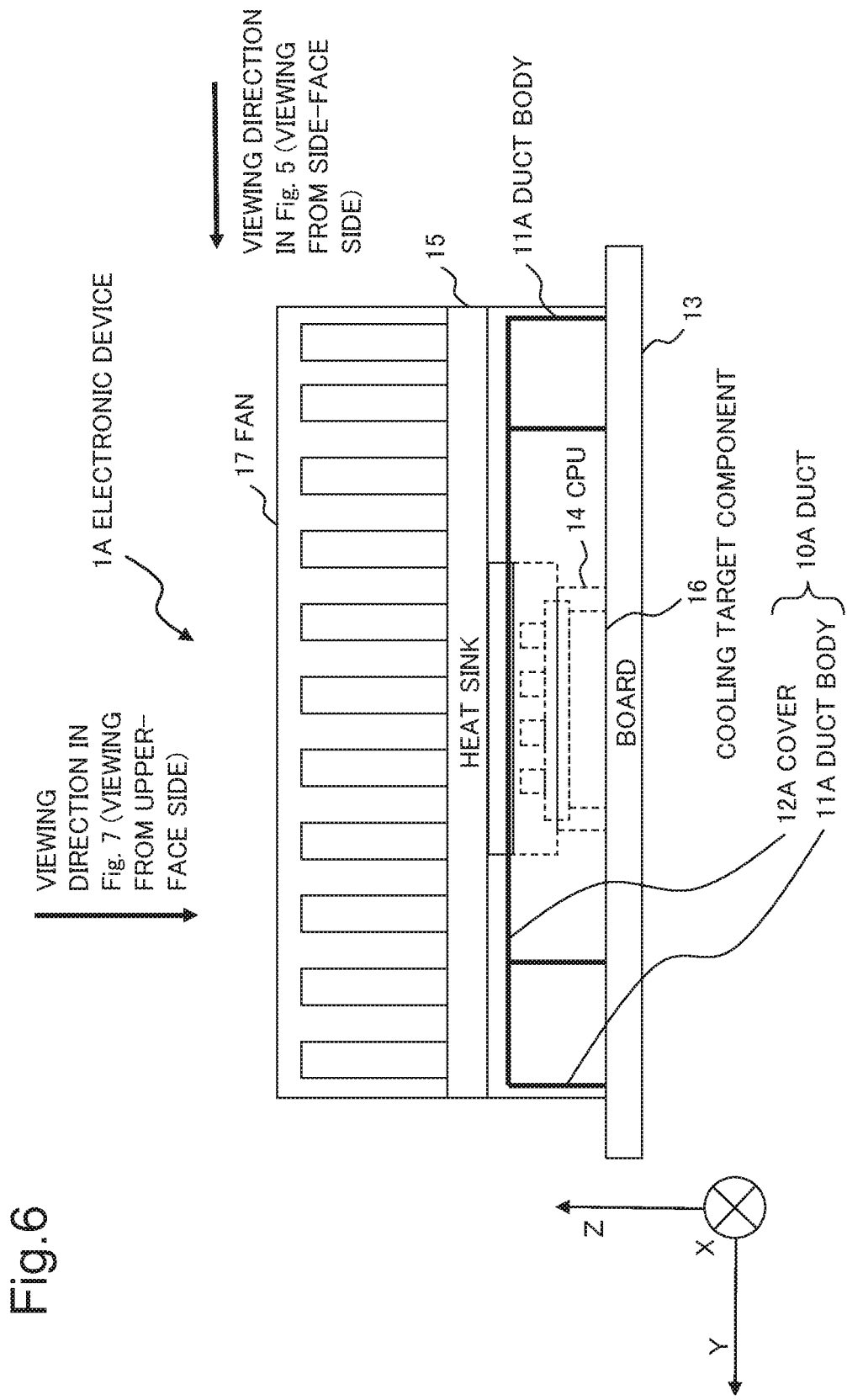
FIG. 6 is a plan view in the case of viewing, from a front-face side, the electronic device 1A according to the second example embodiment of the present invention.
Figure 7:
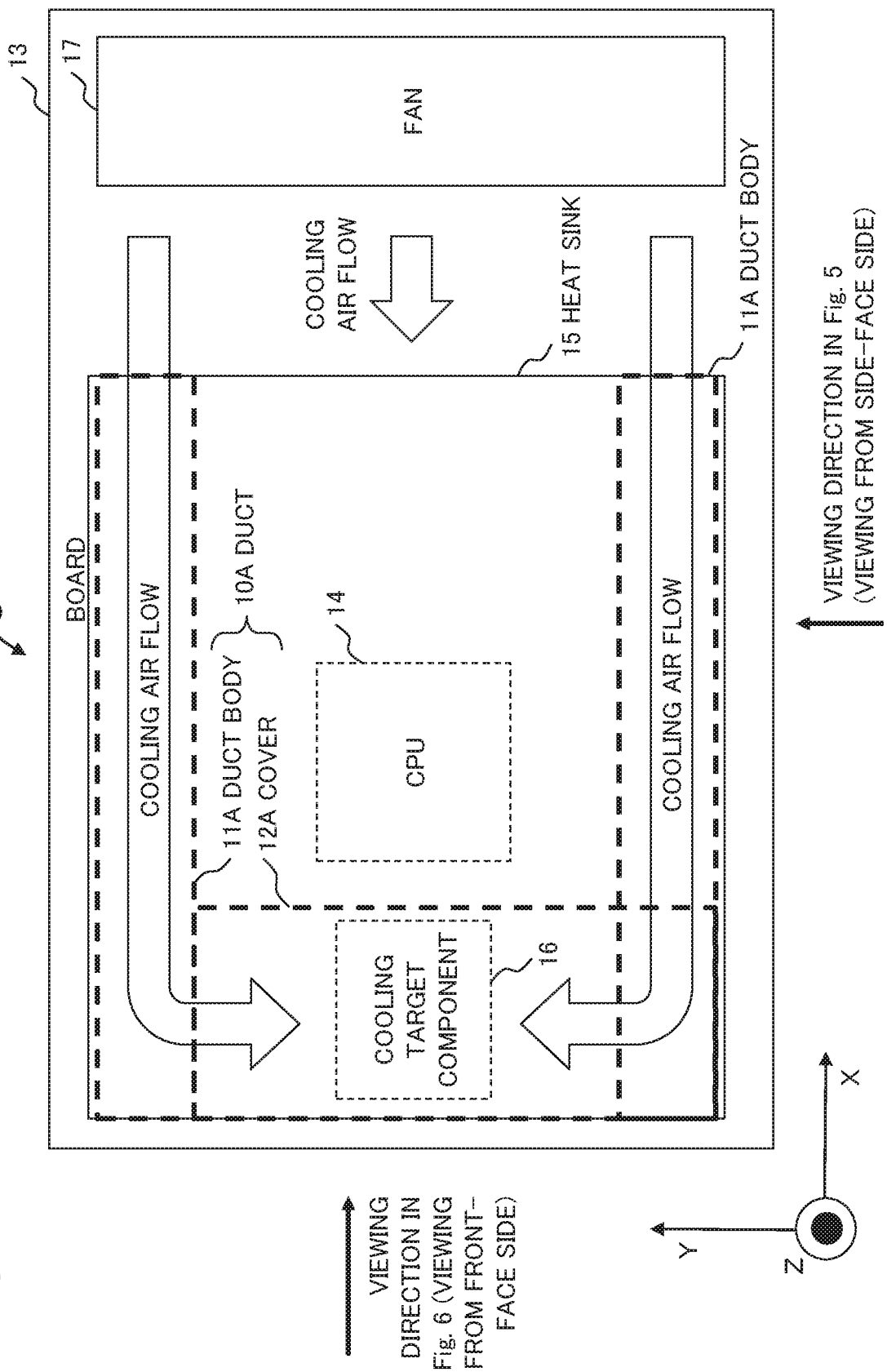
FIG. 7 is a plan view in the case of viewing, from an upper-face side, the electronic device 1A according to the second example embodiment of the present invention.
Figure 8:
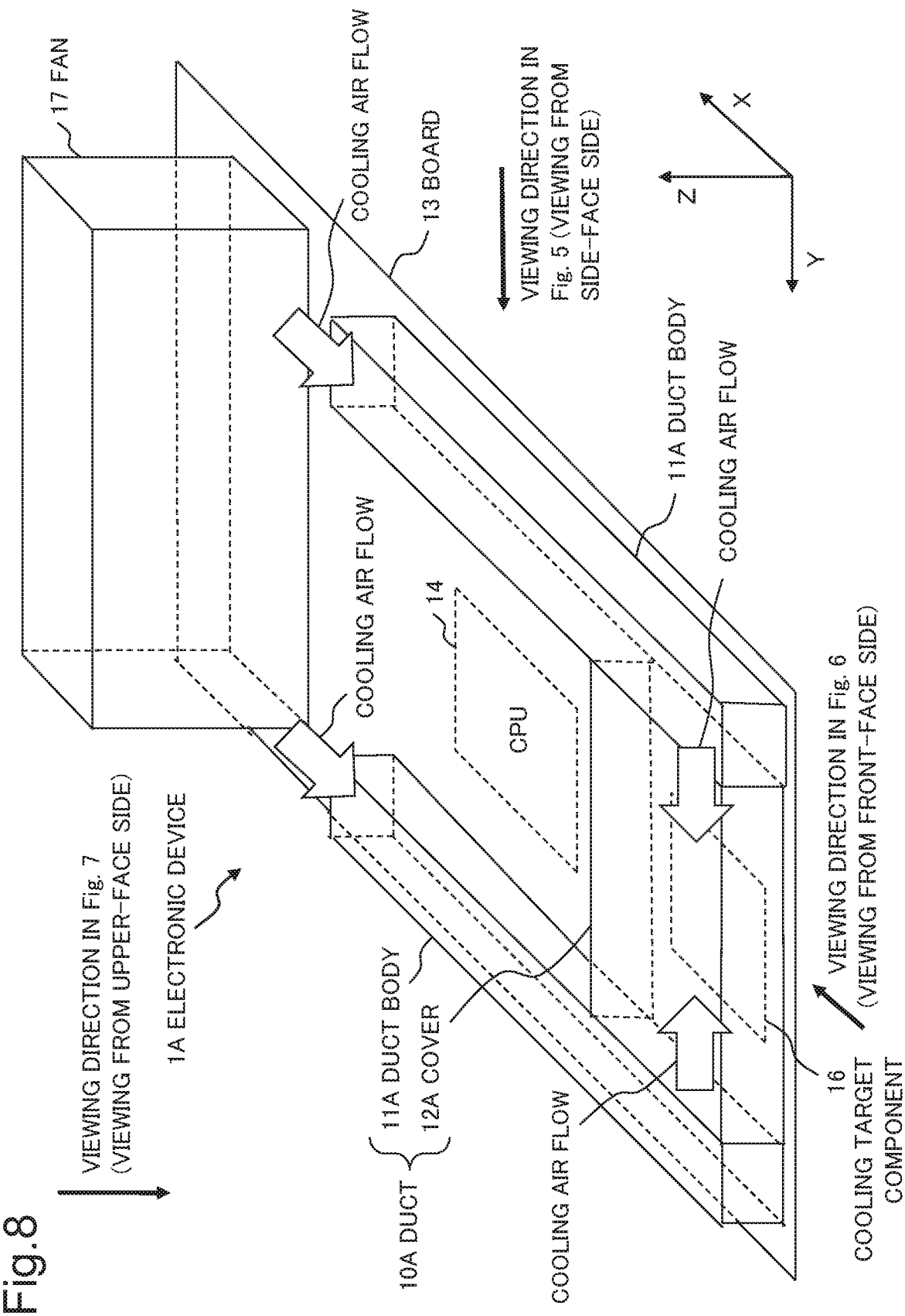
FIG. 8 is a perspective view of the electronic device 1A according to the second example embodiment of the present invention.

FIG. 5 is a plan view (XZ plan view) in the case of viewing, from a side-face side, the electronic device 1A according to the present example embodiment. FIG. 6 is a plan view (YZ plan view) in the case of viewing, from a front-face side, the electronic device 1A according to the present example embodiment. FIG. 7 is a plan view (XY plan view) in the case of viewing, from an upper-face side, the electronic device 1A according to the present example embodiment. FIG. 8 is a perspective view of the electronic device 1A according to the present example embodiment. Note that in FIG. 8, similarly to FIG. 4 described above, for convenience of the description, an illustration of the heat sink 15 is omitted.

As illustrated in FIG. 5 to FIG. 8, the electronic device 1A according to the present example embodiment includes a duct body 11A, a cover 12A, the board 13, the CPU 14, the heat sink 15, the cooling target component 16, and the fan 17. In other words, the electronic device 1A according to the present example embodiment differs from the electronic device 1 according to the first example embodiment described above in that the duct 10A is constituted by the duct body 11A and the cover 12A.

Similarly to the duct 10 according to the first example embodiment, the duct 10A according to the present example embodiment is also formed in such a way as to take in a part of the cooling air flow for cooling at least the heat sink 15, and introduce the taken-in cooling air flow to the cooling target component 16.

On the side of the face (attachment face) that belongs to the board 13 and to which the CPU 14 and the cooling target component 16 are attached, the duct body 11 is provided at a place that is between the heat sink 15 and the board 13 and at which the CPU 14 is not attached, in such a way that the duct body 11 extends along an advancing direction of the cooling air flow discharged from the fan 17 (i.e., extends in parallel or substantially parallel with the X axis). Further, the duct main body 11A is formed as a duct of two routes that sandwich the CPU 14.

The cover 12A is formed, between the heat sink 15 and the board 13, in parallel or substantially parallel with the Y axis in such a way as to cover the cooling target component 16, and is connected to the two routes of the duct body 11A. A hole through which the cooling air flow is able to pass is opened at a connection portion between each of the two routes of the duct body 11A and the cover 12A.

The cooling air flow discharged from the fan 17 first advances in the two routes of the duct body 11A in the negative direction of the X-axis, and then passes through the holes at the connection portions between the duct body 11A and the cover 12A. The cooling air flow that has passed through the hole then advances inside the cover 12A in the positive or negative direction of the Y axis, and thereby reaches the cooling target component 16.

The electronic device 1A according to the present example embodiment is able to sufficiently cool the cooling target component that is between the heat sink increased in size and the board and that is positioned on the side to which the cooling air flow having been applied to the heat sink flows away from the heat sink. The reason is the same as that described in the above-described first example embodiment.

Further, in the electronic device 1A according to the present example embodiment, even when there is no space for forming a duct on the side face of the heat sink 15 along the advancing direction of the cooling air flow, the cooling air flow is able to be made to flow in such a way as to bypass the heat sink 15 preventing the cooling air flow from reaching the cooling target component 16.

Third Example Embodiment

Figure 9:
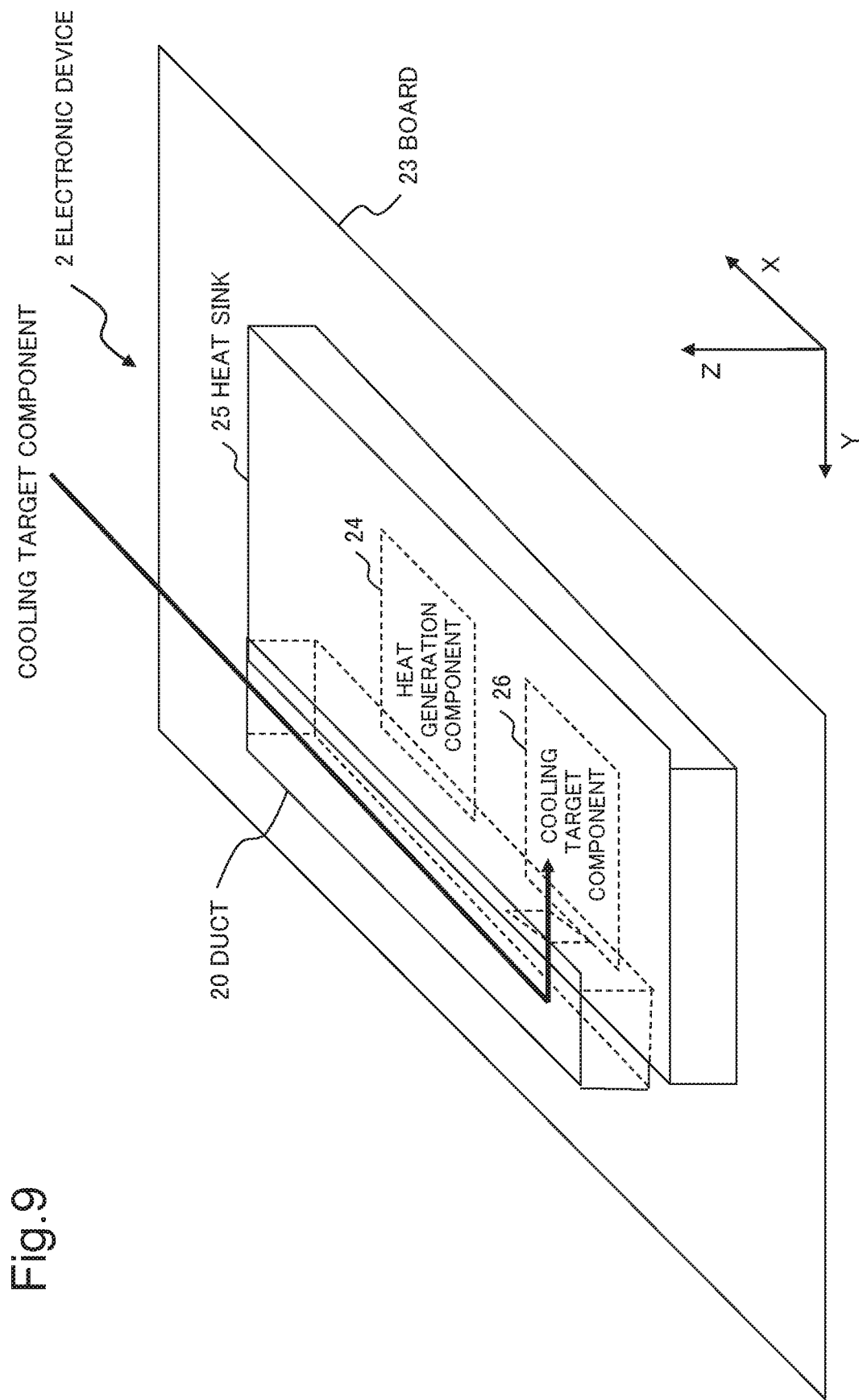
FIG. 9 is a perspective view of an electronic device 2 according to a third example embodiment of the present invention.

FIG. 9 is a perspective view of an electronic device 2 according to a third example embodiment of the present invention.

The electronic device 2 according to the present example embodiment includes a duct 20, a board 23, a heat generation component 24, a heat sink 25, and a cooling target component 26.

The heat generation component 24 is attached to the board 23.

The heat sink 25 radiates heat generated by the heat generation component 24.

The cooling target component 26 is between the board 23 and the heat sink 25, and is attached to the board 23.

The duct 20 is formed in such a way as to take in a part of the cooling air flow for cooling at least the heat sink 25, and to introduce the taken-in cooling air to the cooling target component 26.

The electronic device 2 according to the present example embodiment is able to sufficiently cool the cooling target component that is between the heat sink increased in size and the board and that is positioned on the side to which the cooling air flow having been applied to the heat sink flows away from the heat sink. The reason is that the electronic device 2 includes the duct 20 that takes in a part of the cooling air flow for cooling at least the heat sink 25 and that introduces the taken-in cooling air flow to the cooling target component 26.

While the invention has been particularly shown and described with reference to example embodiments thereof, the invention is not limited to these example embodiments. It will be understood by those of ordinary skill in the art that various changes in form and details may be made therein without departing from the spirit and scope of the present invention as defined by the claims.

The invention claimed is:

1. An electronic device comprising:
a board to which a heat generation component is attached;
a heat sink that radiates heat generated by the heat generation component;
a cooling target component that is between the board and the heat sink, and is attached to the board; and
a duct that takes in a part of a cooling air flow for cooling at least the heat sink, and introduces the cooling air flow which is taken in to the cooling target component, wherein,
the duct includes: a duct body; and a cover that covers the cooling target component, and is formed integrally with the duct body or is formed separately from the duct body to be connected to the duct body, and
at least a part of the cover whose material has a heat blocking property is placed between the heat generation component and the cooling target component.

2. The electronic device according to claim 1, wherein, on a side of a face, on the board, to which the heat generation component and the cooling target component are attached, the duct extends along at least one of faces forming an outer shape of the heat sink, which is different from both a face on a side from which the cooling air flow is taken in and a face on a side from which the cooling air flow flows away, or the duct extends at a place between the heat sink and the board, to which the heat generation component is not attached.

3. The electronic device according to claim 1, wherein the duct is formed in such a way that a cross section perpendicular or substantially perpendicular to a direction in which the duct extends expands toward an inlet for taking in the cooling air flow.

4. The electronic device according to claim 1, wherein a material of the cover is resin.

5. The electronic device according to claim 1, wherein the electronic device further includes a fan that generates the cooling air flow.

6. The electronic device according to claim 5, wherein, from a side of a face from which the heat sink takes in the cooling air flow, the fan discharges the cooling air flow toward the face, or from a side to which the cooling air flow flows away from the heat sink, the fan sucks the cooling air flow.

* * * * *